United States Patent
Chen et al.

(10) Patent No.: US 9,397,422 B2
(45) Date of Patent: *Jul. 19, 2016

(54) CIRCUIT BOARD ASSEMBLY, ELECTRONIC DEVICE HAVING THE SAME, AND LIFTING AND LOWERING APPARATUS THEREOF

(71) Applicant: LENOVO ENTERPRISE SOLUTIONS (SINGAPORE) PTE. LTD.

(72) Inventors: Frank SF Chen, Taipei (TW); Brian CH Lee, Taipei (TW); Edgar MW Tsai, Taipei (TW); Dragon HI Yu, Taichung (TW)

(73) Assignee: LENOVO ENTERPRISE SOLUTIONS (SINGAPORE) PTE. LTD, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/712,390

(22) Filed: May 14, 2015

(65) Prior Publication Data
US 2015/0325936 A1 Nov. 12, 2015

Related U.S. Application Data

(63) Continuation of application No. 13/681,545, filed on Nov. 20, 2012, now Pat. No. 9,048,592.

(30) Foreign Application Priority Data

Nov. 30, 2011 (TW) .............................. 100143896 A

(51) Int. Cl.
*H01R 12/73* (2011.01)
*H01R 12/71* (2011.01)
*H05K 5/00* (2006.01)
*G06F 1/18* (2006.01)
*H01R 13/629* (2006.01)

(52) U.S. Cl.
CPC ................ *H01R 12/71* (2013.01); *G06F 1/184* (2013.01); *G06F 1/185* (2013.01); *H01R 12/73* (2013.01); *H05K 5/0069* (2013.01); *H01R 13/62933* (2013.01)

(58) Field of Classification Search
CPC ........... H05K 7/00; H01R 12/71; H01R 12/73
USPC .............................................. 439/74; 361/758
See application file for complete search history.

(56) References Cited

U.S. PATENT DOCUMENTS 3,701,071 A * 10/1972 Landman ............. H01R 12/714
16/225
4,200,900 A 4/1980 McGeorge
(Continued)

FOREIGN PATENT DOCUMENTS

TW 450505 B 8/2001
TW 279034 U 10/2005

*Primary Examiner* — Dion R Ferguson
*Assistant Examiner* — Mandeep S Buttar
(74) *Attorney, Agent, or Firm* — Patterson + Sheridan LLP

(57) ABSTRACT

A circuit board assembly is provided. The circuit board assembly includes: a first circuit board; a second circuit board; a bracket for supporting the second circuit board; and an interconnect apparatus for a connection and a disconnection of the first circuit board and the second circuit board, wherein the interconnect apparatus includes a first connector disposed on the first circuit board and a second connector disposed on the second circuit board (one is a male connector and the other is a female connector). The circuit board assembly includes a lifting and lowering apparatus for vertically lifting or lowering the bracket so that after the connection the second connector is vertically disconnected from the first connector and after the disconnection the second connector is vertically connected to the first connector. An electronic device having the circuit board assembly is further provided.

7 Claims, 4 Drawing Sheets

(56) References Cited

U.S. PATENT DOCUMENTS

| | | |
|---|---|---|
| 6,791,843 B1 | 9/2004 | Dobbs et al. |
| 6,896,539 B2 | 5/2005 | Dobbs et al. |
| 2004/0257777 A1 | 12/2004 | Barsun et al. |
| 2006/0129732 A1 | 6/2006 | Tsai et al. |
| 2013/0135833 A1 | 5/2013 | Chen et al. |

* cited by examiner

CIRCUIT BOARD ASSEMBLY, ELECTRONIC DEVICE HAVING THE SAME, AND LIFTING AND LOWERING APPARATUS THEREOF

CROSS-REFERENCE TO RELATED APPLICATIONS

This application is a continuation of co-pending U.S. patent application Ser. No. 13/681,545, filed Nov. 20, 2012, which is based on and claims the benefit of priority from Taiwan Patent Application 100143896, filed on Nov. 30, 2011.

BACKGROUND OF THE INVENTION

1. Field of the Invention

The present invention relates to circuit board connection and disconnection, and more particularly, to a circuit board/bracket lifting and lowering apparatus, a circuit board assembly having the same, and an electronic device having the same.

2. Description of the Prior Art

A typical electronic system comprises a plurality of electrical connection assemblies including but not limited to circuit boards and related electrical connection assemblies and interconnects. According to the prior art, circuit boards, electrical connection assemblies, and interconnects have electrical terminals for connection with the electrical terminals of the other circuit boards, electrical connection assemblies, and interconnects.

Conventionally, electrical connection assemblies or interconnects has a male connector and a female connector for connection and engagement. If the pins of the male connector are not accurately aligned with the pins of the female connector before the male connector is inserted into the female connector, the assemblies will be likely to be damaged. In particular, if the male connector and/or the female connector are of a great length, including but not limited to Intel's QuickPath Interconnect (QPI) (QPI is a point-to-point interconnect dedicated to a central processing unit (CPU) and adapted to connect a circuit board and another circuit board), there will be a high chance of damaging the assemblies during a jointing process, thereby reducing their service life greatly.

In another aspect, a process of connecting a circuit board and another circuit board by means including but not limited to three QPI requires applying a large mating force and a large unmating force to between the male connector and the female connector to the detriment of a plugging/unplugging process and operation performed by a user.

Accordingly, it is imperative to provide interconnect technology for use with a circuit board to thereby reduce the chance of damaging its pins, extend its service life, and facilitate the user's operation and application.

SUMMARY OF THE INVENTION

The present invention provides, in an embodiment thereof, a circuit board assembly. The circuit board assembly comprises: a first circuit board; a second circuit board; and a bracket for supporting the second circuit board. The circuit board assembly further comprises an interconnect apparatus for a connection and a disconnection of the first circuit board and the second circuit board, wherein the interconnect apparatus comprises a first connector disposed on the first circuit board and a second connector disposed on the second circuit board so as to effectuate a connection and a disconnection of, wherein one of the first connector and the second circuit board is a male connector, and the other one of the first connector and the second circuit board is a female connector. The circuit board assembly further comprises a bracket lifting and lowering apparatus for vertically lifting and lowering the bracket such that after the connection the second connector is vertically disconnected from the first connector and after the disconnection the second connector is vertically connected to the first connector.

The bracket has a pair of lateral sides each having thereon a curved groove and a sliding groove. The bracket lifting and lowering apparatus comprises a rotary rod having a pair of end portions each provided with a pivotal pin. The bracket lifting and lowering apparatus further comprises a pair of sliding elements slidably disposed in the sliding grooves, respectively. The sliding elements each have thereon a linear guiding groove and a supporting stand guiding groove of a specific inclination. The rotary rod is pivotally coupled to the bracket by means of the pivotal pins and the curved grooves. The sliding elements are engaged with the bracket by means of the pivotal pins and the linear guiding grooves. The bracket lifting and lowering apparatus further comprises a pair of supporting stands fixed to the first circuit board and slidably disposed in the supporting stand guiding grooves, respectively.

In response to the rotation of the rotary rod in a first direction, the pivotal pins follow a continuum of intersections of each said linear guiding groove and a corresponding one of the curved grooves to thereby allow the sliding elements to undergo a horizontal displacement. The horizontal displacement of the sliding elements is accompanied by a vertical displacement of the bracket and the second circuit board because of joint operation of engagement of the sliding elements with the bracket, the supporting stands fixed to the first circuit board, and the supporting stand sliding grooves of a specific inclination.

The present invention provides, in another embodiment thereof, an electronic device. The electronic device comprises a casing and a circuit board assembly. The circuit board assembly comprises: a first circuit board; a second circuit board; and a bracket for supporting the second circuit board. The circuit board assembly further comprises an interconnect apparatus for a connection and a disconnection of the first circuit board and the second circuit board. The interconnect apparatus comprises a first connector disposed on the first circuit board and a second connector disposed on the second circuit board for a connection or a disconnection thereof. One of the first connector and the second circuit board is a male connector, whereas the other one of the first connector and the second circuit board is a female connector. The circuit board assembly further comprises a bracket lifting and lowering apparatus for vertically lifting and lowering the bracket such that after the connection the second connector is vertically disconnected from the first connector and after the disconnection the second connector is vertically connected to the first connector.

The present invention provides, in yet another embodiment thereof, a lifting and lowering apparatus applicable to a circuit board assembly. The circuit board assembly comprises: a first circuit board; a second circuit board; and an interconnect apparatus for a connection and a disconnection of the first circuit board and the second circuit board. The interconnect apparatus comprises a first connector disposed on the first circuit board and a second connector disposed on the second circuit board for a connection or a disconnection thereof. The circuit board assembly further comprises a bracket for supporting the second circuit board. The bracket has a pair of lateral sides. The lateral sides each have thereon a curved groove and a sliding groove. The lifting and lowering apparatus comprises a rotary rod having a pair of end portions each provided with a pivotal pin. The lifting and lowering apparatus further comprises a pair of sliding elements slidably disposed in the sliding grooves, respectively. The sliding elements each have thereon a linear guiding groove and a supporting stand guiding groove of a specific inclination. The rotary rod is pivotally coupled to the bracket by the pivotal pins and the curved grooves. The sliding elements are engaged with the bracket by the pivotal pins and the linear guiding grooves. The lifting and lowering apparatus further comprises a pair of supporting stands fixed to the first circuit board and slidably disposed in the supporting stand guiding grooves, respectively. In response to the rotation of the rotary rod in a first direction, the pivotal pins follow a continuum of intersections of each said linear guiding groove and a corresponding one of the curved grooves to thereby allow the sliding elements to undergo a horizontal displacement and allow the bracket to undergo a vertical displacement.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings. In the drawings.

DETAILED DESCRIPTION OF THE EMBODIMENTS

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Figure 1:
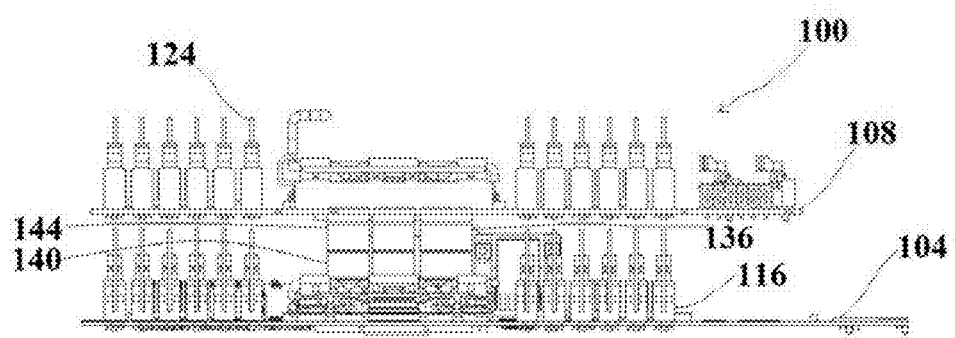
FIG. 1 is a schematic view of an electronic system according to a preferred embodiment of the present invention.

Referring to FIG. 1, there is shown a schematic view of an electronic system 100 according to a preferred embodiment of the present invention, showing a first circuit board 104 and a second circuit board 108 which are electrically coupled to each other. Normally, the electronic system 100 comprises a plurality of electrical connection assemblies and further comprises circuit boards and connector-related assemblies. An electrical circuit-related portion of each circuit board has electrical terminals which are connected to the electrical terminals of another circuit board via electrical connection assemblies or interconnects.

The first circuit board 104 includes but is not limited to a primary circuit board mounted thereon with a first assembly 116. The first assembly 116 comprises one or more integrated circuits or one or more packaged integrated circuits including but not limited to a first central processing unit (CPU). The first assembly 116 further comprises various electromechanical assemblies. The second circuit board 108 includes but is not limited to a secondary circuit board 108 mounted thereon with a second assembly 124. The second assembly 124 comprises one or more integrated circuits or one or more packaged integrated circuits including but not limited to a second central processing unit (CPU). The second assembly 124 further comprises a dynamic random-access memory (DRAM) and various electromechanical assemblies. The first circuit board 104 and the second circuit board 108 are connected by interconnects 136. The interconnects 136 include but are not limited to an QPI, HyperTransport (HT) of Advanced Micro Devices (AMD), or conventional connectors disclosed in the related prior art. Take the QPI 136 as an example, it is provided with a male connector 140 and a female connector 144. Pins (not shown) of the male connector 140 are inserted into and engaged with pin-receiving holes (not shown) of the female connector 144, respectively, as soon as the male connector 140 comes into snap-engagement with the female connector 144. However, according to the prior art, a male connector of the QPI is 12 mm long, whereas a female connector of the QPI is 36.5 mm long; hence, the process of aligning the pins with the pin-receiving holes is susceptible to offset and thus misalignment. As a result, forced engagement causes damage to the pins or pin-receiving holes and shortens their service life.

Figure 2:
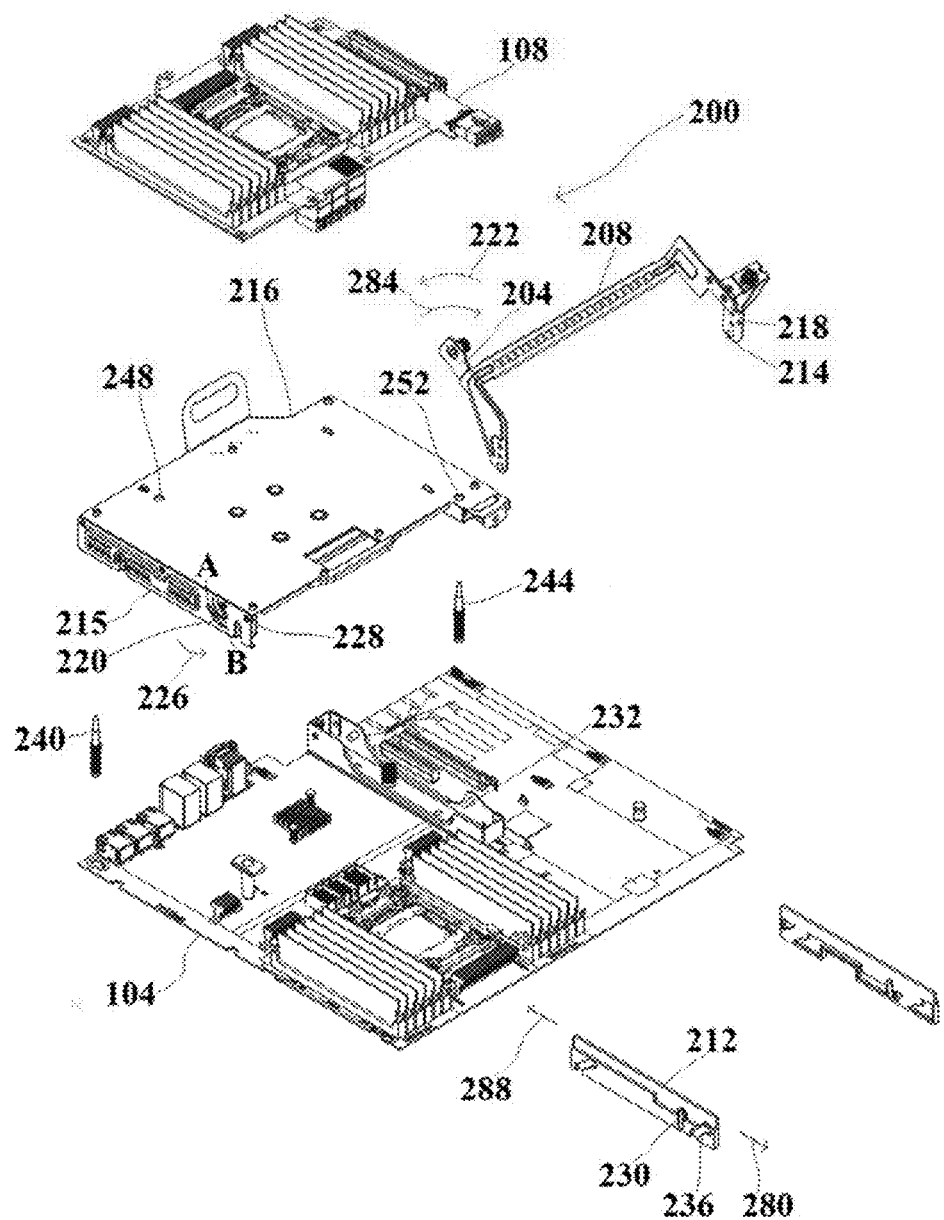
FIG. 2 is an exploded view of the electronic system according to a preferred embodiment of the present invention.

Referring to FIG. 2, there is shown an exploded view of the electronic system 100 according to a preferred embodiment of the present invention. In a preferred embodiment of the present invention, a lifting and lowering apparatus 200 comprises a handle body 208, a rotary rod 204, and a pair of sliding elements 212. Referring to FIG. 2, the lifting and lowering apparatus 200 further comprises a bracket 216 for supporting the second circuit board 108 and a pair of pivotal pins 214. The pivotal pins 214 are riveted to a pair of end portions 218 of the rotary rod 204. The bracket 216 has a pair of lateral sides 215 each having thereon a curved groove 220 for operating in conjunction with the rotary rod 204 and the pivotal pins 214 (as described in detail below.)

The handle body 208 is intended to be gripped by a user for controlling the vertical displacement of the bracket 216 and the second circuit board 108. The end portions 218 of the rotary rod 204 are pivotally coupled to the bracket 216 by means of the pivotal pins 214 and the curved grooves 220, such that the user can operate the handle body 208 in a first direction 222 (including but not limited to a counterclockwise direction); as a result, the end portions 218 of the rotary rod 204 move relative to the bracket 216 from point A to point B in a linked motion direction 226 (including but not limited to an counterclockwise direction). That is to say, the pivotal pins 214 move along the curved grooves 220 and rotate by a specific angle, respectively. The rotary rod 204 functions as an active component for use in axial rotation, and its rotational angle is controlled with the handle body 208 operated by the user. The handle body 208 and the rotary rod 204 are integrally formed as a unitary structure or connected by a connecting element, but the present invention is not limited thereto.

The sliding elements 212 are disposed on the inner sides of the lateral sides 215 of the bracket 216 by means of a pair of sliding grooves 228 thereon, respectively. An engaging guiding groove 230 is disposed on each of the sliding elements 212 for snap-engagement with a corresponding one of the pivotal pins 214 of the rotary rod 204. Hence, the pivotal pins 214 are not only coupled to the rotary rod 204 and the bracket 216 and engaged with the curved grooves, but also snap-engaged with the sliding elements 212 as soon as the sliding elements 212 are positioned at the bracket 216.

The engaging guiding groove 230 is of a shape of a linear guiding groove. Given the aforesaid arrangement as well as the joint operation of the pivotal pins 214, the curved grooves 220, and the engaging guiding groove 230, once the user starts to operate the handle body 208 in the first direction 222 (including but not limited to a counterclockwise direction), the sliding elements 212 will move in a first sliding element direction 280 (including but not limited to a rightward horizontal direction). If the user operates the handle body 208 in a second direction 284 (including but not limited to a clockwise direction), the sliding elements 212 will move in a second sliding element direction 288 (including but not limited to a leftward horizontal direction). The aforesaid movement of the sliding elements is enabled mainly by the appropriate design of the intersections of the linear guiding groove 230 and the curved groove 220 to thereby effectuate leftward and rightward motion.

FIG. 2 shows a pair of supporting stands 232 fixed to the first circuit board 104 and a pair of supporting stand guiding grooves 236 disposed on the bracket 216, wherein the supporting stand guiding groove 236 has a specific inclination. As described above, the pivotal pins 214 come into snap-engagement with the sliding elements 212 as soon as the sliding elements 212 are positioned at the bracket 216; hence, if the sliding elements move rightward and horizontally, the sliding elements 212 will be pushed upward to thereby abut against the bracket 216 and the second circuit board 108 because of the oblique supporting stand guiding groove 236 and the supporting stands 232 fixed to the first circuit board 104; as a result, the bracket 216 and the second circuit board 108 move vertically upward. If the sliding elements 212 move leftward and horizontally, the sliding elements 212 will drive the second circuit board 108 and the second assembly 124 to move downward because of the oblique supporting stand guiding grooves 236 and the supporting stands 232 fixed to the first circuit board 104; as a result, the bracket 216 and the second circuit board 108 move vertically downward. That is to say, given appropriate design, the rotation of the rotary rod 204 drives the bracket 216 and the second circuit board 108 to move vertically, that is, upward and downward.

FIG. 2 shows guide pins 240, 244 disposed on the first circuit board 104. The guide pins 240, 244 operate in conjunction with holes 248, 252 on the bracket 216 with a view to providing a preliminary guide before the male connector 140 and the female connector 144 are connected together, so as to prevent misalignment-induced damage which might otherwise occur as a result of the preliminary connection of the male connector 140 and the female connector 144.

As described above, the rotary rod 204 and the bracket 216 are linked together in accordance with an axis of motion, whereas the pivotal pins 214 move along the curved grooves 220. Due to a continuum of intersections of the linear guiding groove 230 and the curved groove 220, the sliding elements 212 are slidably disposed inside the bracket 216 and move horizontally. However, the bracket 216 and the second circuit board 108 move in a vertical direction, and thus the connectors are less likely to get damaged because of offset and misalignment.

Figure 3:
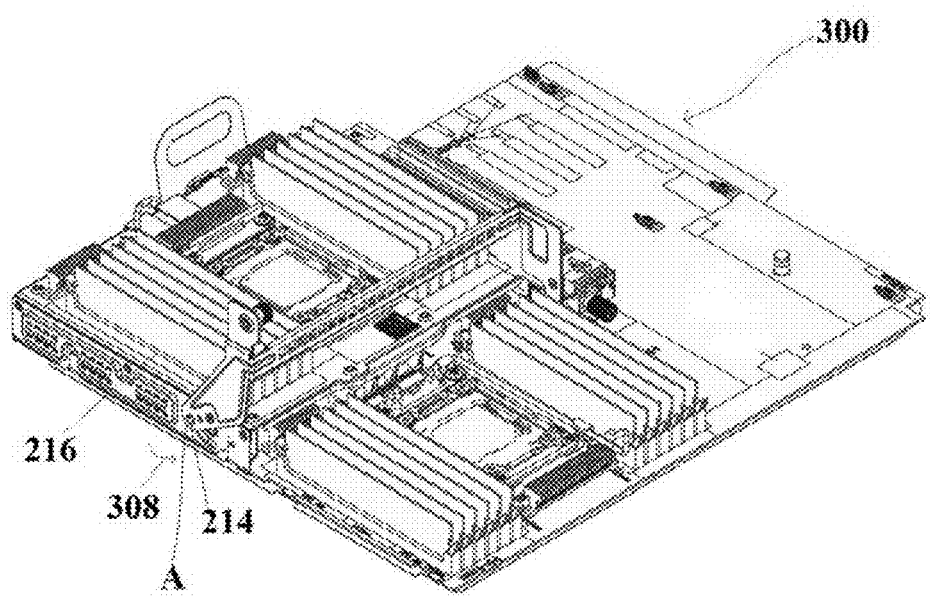
FIG. 3 is a perspective view of a bracket mobile device according to a preferred embodiment of the present invention.
Figure 4:
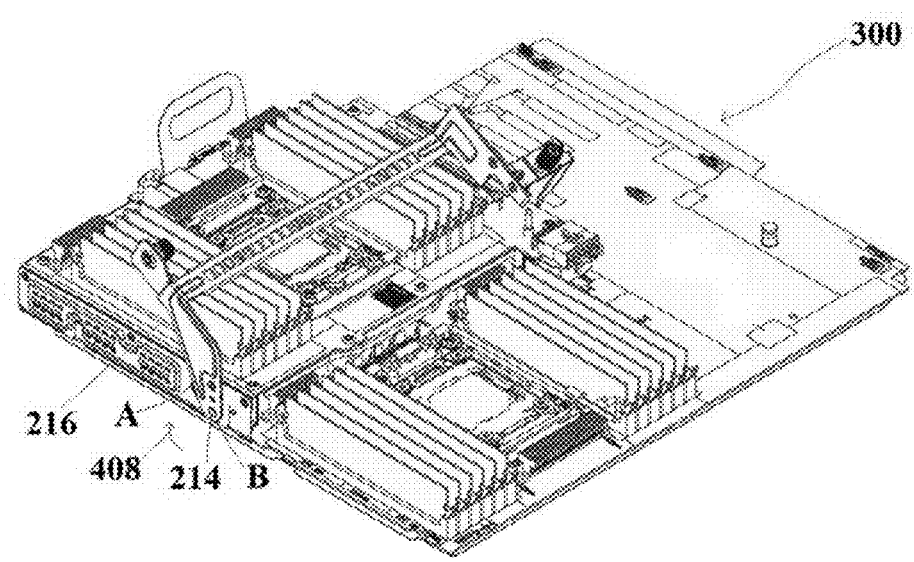
FIG. 4 is a perspective view of the bracket mobile device according to a preferred embodiment of the present invention.

Referring to FIG. 3 and FIG. 4, there are perspective views of a preferred embodiment of the present invention, illustrating its use and its course of motion and related details. Referring to FIG. 1 through FIG. 3, the aforesaid assemblies are mounted on the first circuit board 104 to implement an electronic device 300 (see FIG. 3). The electronic device 300 has other assemblies, such as a casing (not shown) and a fan (not shown). The aforesaid assemblies are part of a conventional electronic device assembly and thus are not described herein in detail for the sake of brevity. Referring to FIG. 3, the pivotal pins 214 are located at point A, that is, the starting point, and thus the male connector 140 and the female connector 144 are in a coupled state; meanwhile, the bracket 216 and the second circuit board 108 are flatly positioned on the first circuit board 104. Once the user starts to operate the handle body 208 and actuate the rotary rod 204, the pivotal pins 214 will move toward point B in a third direction 308, that is, a destination point.

Referring to FIG. 1 through FIG. 4, after the user has driven the rotary rod 204 to rotate, the pivotal pins 214 move along the curved grooves 220 from point A to point B, respectively; that is to say, the pivotal pins 214 move along the curved grooves 220 and rotate by a specific angle, respectively. Hence, the male connector 140 and the female connector 144 are released from the initial coupled state in a vertical manner. The aforesaid assemblies undergo coordinated operation, such that the bracket 216 moves vertically and upward because of the rotation of the rotary rod 204; meanwhile, the bracket 216 and the second circuit board 108 move upward vertically relative to the first circuit board 104.

Similarly, if the user operates the handle body 208 once again and actuates the rotary rod 204, the pivotal pins 214 will move from point B to point A in a fourth direction 408; meanwhile, the bracket 216 and the second circuit board 108 move downward and vertically relative to the first circuit board 104, such that the male connector 140 and the female connector 144 return to the coupling state once again in a vertical manner.

In conclusion, in an embodiment of the present invention, the male connector 140 and the female connector 144 are connected together and disconnected from each other by being vertically lifted and lowered, not only to prevent the pins from being damaged because of misalignment of the male connector 140 and the female connector 144, but also to extend the service life of the connectors. An embodiment of the present invention not only meets the tool-less requirement, but also greatly reduces the forces required for the connection and disconnection of connectors and thereby prevents other circuit boards and connectors from being damaged during the installation process thereof.

In another aspect, from the perspective of the connection and disconnection of a circuit board and another circuit board, an embodiment of the present invention enables the laborsaving plugging/unplugging of connectors and releases a mating force otherwise applied to a connector beforehand by means of the rotation of a rotary rod and related lever operations, thereby rendering it easy to plug and unplug a male connector and a female connector.

The foregoing preferred embodiments are provided to illustrate and disclose the technical features of the present invention, and are not intended to be restrictive of the scope of the present invention. Hence, all equivalent variations or modifications made to the foregoing embodiments without departing from the spirit embodied in the disclosure of the present invention should fall within the scope of the present invention as set forth in the appended claims.

What is claimed is:

1. A circuit board assembly, comprising:
a first circuit board;
a second circuit board;
a bracket for supporting the second circuit board, wherein the bracket comprises a pair of lateral sides each having a curved groove and a sliding groove;
an interconnect apparatus for a connection and a disconnection of the first circuit board and the second circuit board, wherein the interconnect apparatus comprises a first connector disposed on the first circuit board and a second connector disposed on the second circuit board; and
a bracket lifting and lowering apparatus for vertically lifting and lowering the bracket, wherein the bracket lifting and lowering apparatus comprises:
a rotary rod having a pair of end portions which each include a pivotal pin, wherein the pivotal pins couple the rotary rod to the bracket and the curved grooves, and
a pair of sliding elements slidably disposed in the sliding grooves.

2. The circuit board assembly of claim 1, wherein the sliding elements each having thereon a linear guiding groove and a supporting stand guiding groove of a specific inclination, wherein the rotary rod is pivotally coupled to the bracket by the pivotal pins and the curved grooves, wherein the sliding elements are engaged with the bracket through the pivotal pins and the linear guiding grooves,
wherein the bracket lifting and lowering apparatus comprises a pair of supporting stands fixed to the first circuit board and slidably disposed in the supporting stand guiding grooves, respectively.

3. The circuit board assembly of claim 2, wherein, in response to rotation of the rotary rod in a first direction, the pivotal pins follow a continuum of intersections of each said linear guiding groove and a corresponding one of the curved grooves to thereby allow the sliding elements to undergo a horizontal displacement, wherein the horizontal displacement of the sliding elements is accompanied by a vertical displacement of the bracket and the second circuit board because of joint operation of engagement of the sliding elements with the bracket, the supporting stands fixed to the first circuit board, and the supporting stand sliding grooves of a specific inclination.

4. The circuit board assembly of claim 1, wherein the first connector and the second connector are one selected from the group consisting of an QPI and HyperTransport (HT), wherein a first assembly is disposed on the first circuit board and is one selected from the group consisting of a CPU and a memory, wherein a second assembly is disposed on the second circuit board and is one selected from the group consisting of a CPU and a memory.

5. An electronic device, comprising: a circuit board assembly, comprising: a first circuit board; a second circuit board; a bracket for supporting the second circuit board, wherein the bracket comprises a pair of lateral sides each having a curved groove and a sliding groove; an interconnect apparatus for a connection and a disconnection of the first circuit board and the second circuit board, the interconnect apparatus comprising a first connector disposed on the first circuit board and a second connector disposed on the second circuit board for a connection or a disconnection thereof; a bracket lifting and lowering apparatus for vertically lifting and lowering the bracket such that after the connection the second connector is vertically disconnected from the first connector and after the disconnection the second connector is vertically connected to the first connector, wherein the bracket lifting and lowering apparatus comprises: a rotary rod having a pair of end portions each having thereon a pivotal pin; and a pair of sliding elements slidably disposed in the sliding grooves, respectively, the sliding elements each having thereon a linear guiding groove and a supporting stand guiding groove of a specific inclination.

6. The electronic device of claim 5, wherein the rotary rod is pivotally coupled to the bracket by the pivotal pins and the curved grooves, wherein the sliding elements are engaged with the bracket by the pivotal pins and the linear guiding grooves, wherein the bracket lifting and lowering apparatus comprises: a pair of supporting stands fixed to the first circuit board and slidably disposed in the supporting stand guiding grooves, respectively.

7. The electronic device of claim 6, wherein, in response to rotation of the rotary rod in a first direction, the pivotal pins follow a continuum of intersections of each said the linear guiding groove and a corresponding one of the curved grooves to thereby allow the sliding elements to undergo a horizontal displacement, wherein the horizontal displacement of the sliding elements is accompanied by a vertical displacement of the bracket and the second circuit board because of joint operation of engagement of the sliding elements with the bracket, the supporting stands fixed to the first circuit board, and the supporting stand sliding grooves of a specific inclination.

* * * * *